(12) United States Patent
Fu et al.

(10) Patent No.: US 6,744,293 B1
(45) Date of Patent: Jun. 1, 2004

(54) GLOBAL CLOCK TREE DE-SKEW

(75) Inventors: Wei Fu, San Diego, CA (US); Joseph J. Balardeta, Del Mar, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 175 days.

(21) Appl. No.: 10/120,576

(22) Filed: Apr. 9, 2002

(51) Int. Cl.[7] .................................................. H03L 7/06
(52) U.S. Cl. ...................................... 327/158; 327/156
(58) Field of Search .............................. 327/158, 156, 327/147, 148, 149, 150, 157, 159, 160, 142, 198, 153, 154, 155, 161, 162, 163, 293, 295, 296; 375/371, 373, 375, 376; 331/34, DIG. 2, 25

(56) References Cited

U.S. PATENT DOCUMENTS

| | | | | |
|---|---|---|---|---|
| 5,552,727 A | * | 9/1996 | Nakao | 327/159 |
| 5,629,651 A | * | 5/1997 | Mizuno | 331/34 |
| 5,822,573 A | * | 10/1998 | Saeki et al. | 713/503 |
| 5,994,934 A | * | 11/1999 | Yoshimura et al. | 327/158 |
| 6,437,616 B1 | * | 8/2002 | Antone et al. | 327/158 |

* cited by examiner

Primary Examiner—Linh M. Nguyen
(74) Attorney, Agent, or Firm—Incaplaw; Terrance A. Meador

(57) ABSTRACT

A circuit and method for de-skewing a global clock tree is disclosed. A circuit uses a digital delay lock loop having an incoming clock input, a local reference clock input, and a clock output providing an output clock signal. The delay lock loop receives an incoming clock signal and aligns it with a local reference clock signal, where the incoming clock signal is a skewed version of the local reference clock signal. The circuit further includes a clock tree for receiving the output clock signal and outputting a global clock signal when the delay lock loop is in lock mode. The output clock signal of the global clock tree represents a phase lock between an incoming clock signal on the incoming clock input and a local reference clock signal input on the local reference clock input.

9 Claims, 3 Drawing Sheets

GLOBAL CLOCK TREE DE-SKEW

BACKGROUND OF THE INVENTION

The present invention generally relates to digital communications, and more particularly to a delay lock (DLL) circuit for de-skewing a global clock tree.

The circuits which comprise a digital device usually operate under control of a clock signal. When coordination and synchronization are required, it is disadvantageous for each circuit to operate under its own local clock signal. For proper synchronization, a global clock tree is sometimes used, in which a global clock signal is distributed to various locations on a chip for local clock control.

Unfortunately, the global clock signal may become skewed from its original form by the time it arrives at a certain location on the chip or in a system. For instance, a long wire routing of the global clock signal may introduce delay into the signal. Or, the global clock tree may suffer from insertion delay on one or more of its clock branches. The problem of clock skew is exacerbated at higher clock speeds for faster processing.

DETAILED DESCRIPTION OF THE PREFERRED EMBODIMENTS

This invention solves the problem of global clock tree skew by the use of an all digital delay lock loop (DLL) for reducing skew between an incoming clock signal and a local reference clock signal, in which the incoming clock signal is based on a global clock signal provided by the global clock tree. In one example of the invention, a method includes receiving an incoming clock signal at a delay lock loop, and aligning the incoming clock signal with a local reference clock signal at the delay lock loop, wherein the incoming clock signal is a skewed version of the local reference clock signal.

In another example of the invention, a circuit for de-skewing a global clock tree includes a digital delay lock loop and a clock tree. The digital delay lock loop has an incoming clock input, a local reference clock input, and a clock output. The clock output provides an output clock signal to the clock tree, where the output clock signal represents a phase lock between an incoming clock signal on the incoming clock input and a local reference clock signal input on the local reference clock input. The clock tree receives the output clock signal and outputs a global clock signal.

In yet another example, a circuit for de-skewing a global clock tree includes a digital delay lock loop comprising a clock variable delay unit (VDU), a clock buffer, a phase detector having an input connected to an output of the clock buffer, a lock detector having an input connected to an output of the phase detector, and a loop control circuit having an input connected to the output of the phase detector and an output connected to a first input of the clock VDU. The circuit further includes a local reference clock signal input connected to an output of the lock detector and to an input of the clock buffer, and an incoming clock signal input connected to a second input of the clock VDU. The delay lock loop aligns the incoming clock signal with the local reference clock signal, where the incoming clock signal is a skewed version of the local reference clock signal.

Figure 1:
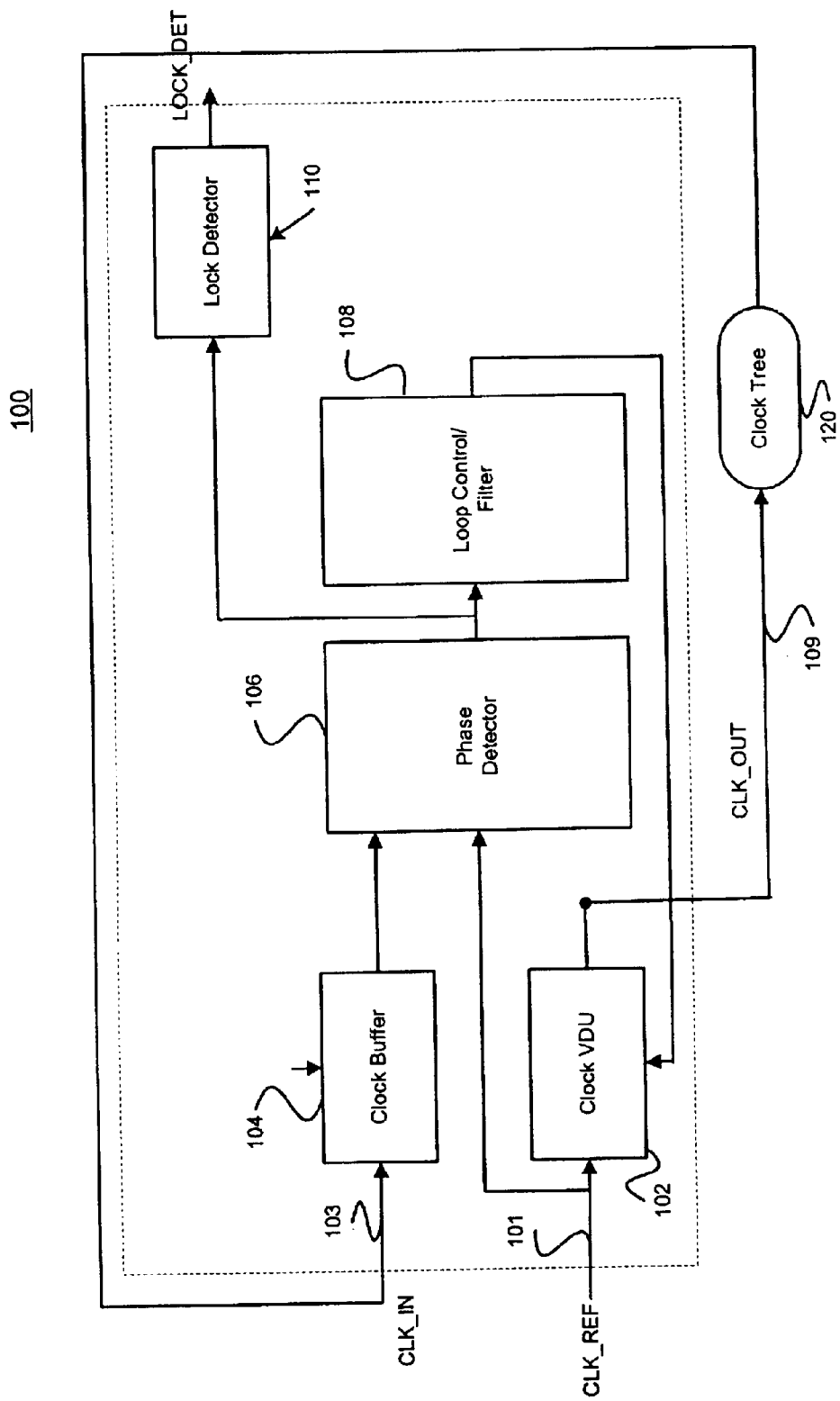
FIG. 1 depicts a global clock de-skew circuit according to an embodiment of the invention.
Figure 2:
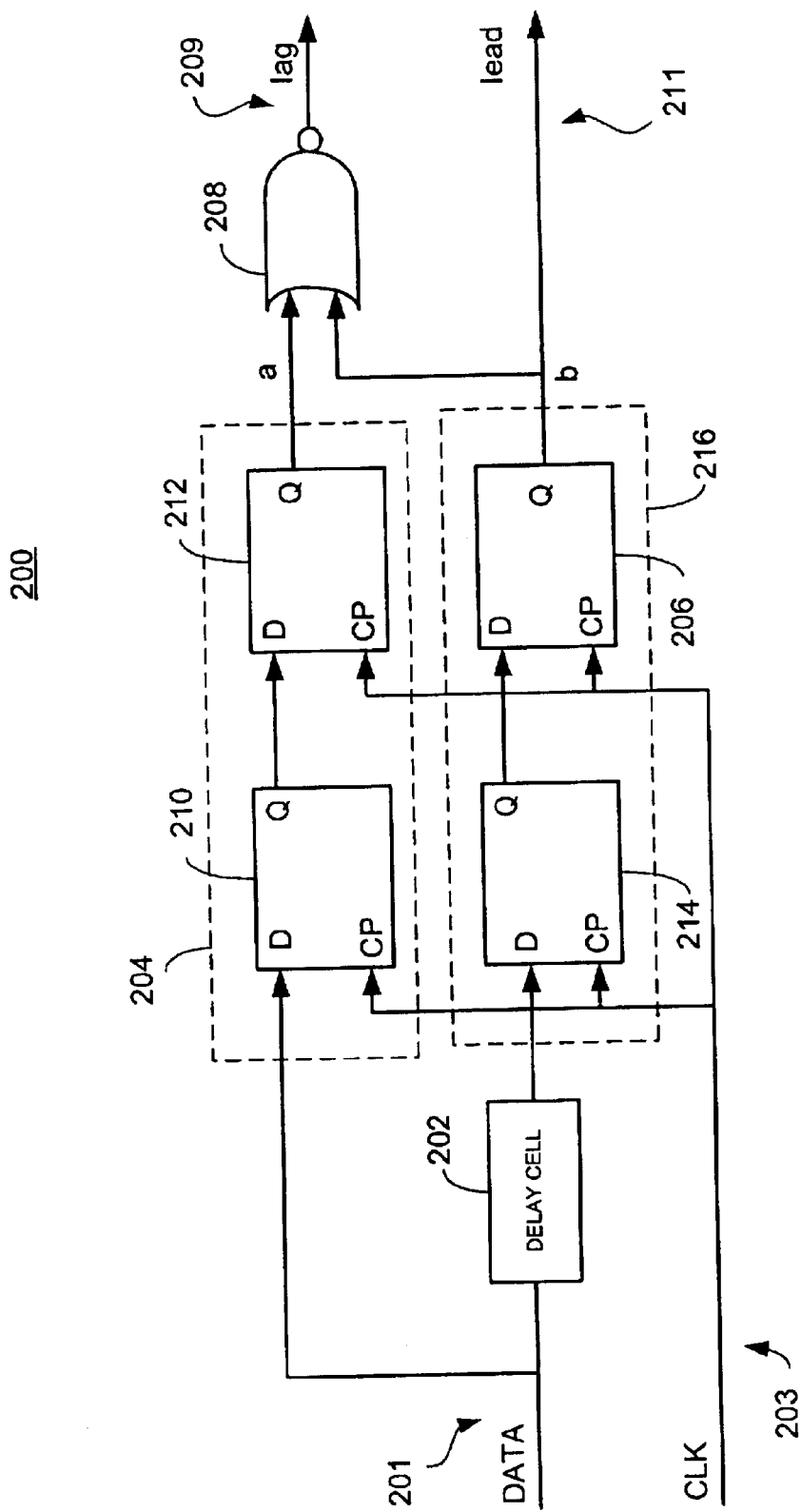
FIG. 2 illustrates a preferred embodiment of a phase detector for use with the global clock de-skew circuit of the invention.
Figure 3:
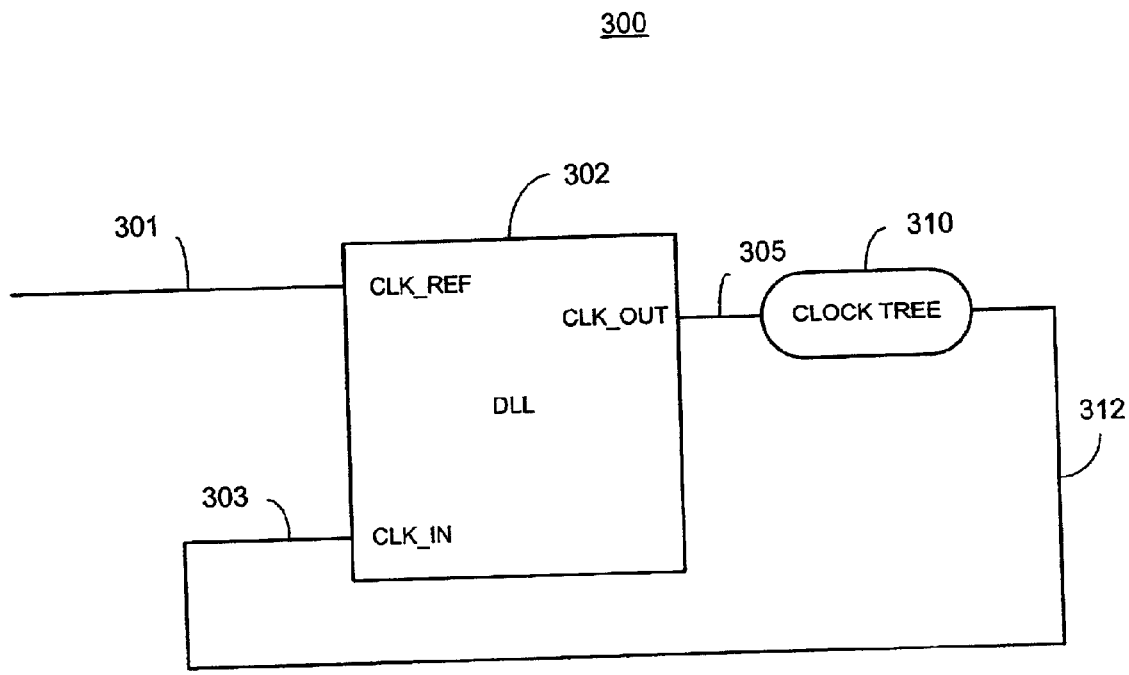
FIG. 3 is a simplified circuit diagram of a circuit for de-skewing a global clock tree according to an embodiment of the invention.

These and other embodiments will be readily apparent to a person of ordinary skill in the art with reference to FIGS. 1–3 and the accompanying description of the preferred embodiments of the invention.

FIG. 1 is a simplified block diagram of a global clock tree de-skew circuit 100. The circuit 100 includes a local reference clock signal line 101, a clock variable delay unit (VDU) 102, an incoming clock signal line 103 which is also a feedback line of the circuit, and a phase detector 108 having a lead output and a lag output. The phase detector 108 is preferably a non-resonance mode bang-bang phase detector (BBPD) as described herein below. However, the phase detector 108 could also be a linear phase detector (LPD) or other detection circuit for detecting a phase difference between two signals. The circuit 100 further includes a loop control circuit 108, a lock detection circuit 110, a clock output 109, and a clock tree 120.

The incoming clock signal line 103 is connected to an input of the clock buffer 104. The local reference clock signal line 101 is connected to a first input of the clock VDU 102. The phase detector 106 includes a first input connected to an output of the clock buffer 104 for receiving an offset incoming clock signal, and a second input connected to the local reference clock signal line 101 for receiving the local reference clock signal. The loop control circuit 108 includes an input connected to an output of the phase detector 106, and an output connected to a second input of the clock VDU 102. The lock detection circuit 110 includes an input connected to the output of the phase detector 106. The clock tree 120 is connected to the clock output 109, which is connected to the output of the clock VDU 102.

The clock VDU 102 delays a local reference clock signal on the local reference clock signal line 101 in order to align the phase of the local reference clock signal with an incoming clock signal on the incoming clock signal line 103. The amount of delay is controlled by the loop control circuit 108 and fed back to the clock VDU 102 for controlling an amount of delay to be applied to a local reference clock signal on the local reference clock signal input 101. Initially, the clock VDU 102 is set to a nominal, i.e. midpoint, delay, and the circuit 100 will attempt to align the phase of the two clock signals at the phase detector 106 by speeding up or delaying the local reference clock signal. Once the loop has stabilized, the incoming input clock signal will have nearly the same phase, with some variation or offset, as the local reference clock signal.

The lock detection circuit 110 monitors the phase detector 106 output to determine if the two clock signals, the incoming clock signal from the clock buffer 104 and the local reference clock signal, are phase aligned. Alternatively, the lock detection circuit 110 can be connected to the output of the loop control circuit 108. Once aligned, the lock detection circuit 110 generates a lock signal to output a HIGH signal, and the second loop is enabled. The lock detection circuit 110 can be equipped with hysteresis to ensure metastability is not an issue.

The loop control circuit 108 includes a filter. In a preferred embodiment, a nonlinear digital filter is used in order to achieve low jitter performance. The nonlinearity of the filter is applied to cancel the nonlinearity of the phase detector 106, and it results in low jitter performance characteristics when the global clock tree de-skew circuit 100 is in lock mode.

Also during the lock mode, oscillation will occur at the output of the phase detector 106. Preferably a no-resonance bang bang phase detector is used to eliminate resonance caused by the oscillation. FIG. 2 shows a preferred embodiment of a bang bang phase detector 200 in accordance with the invention. The phase detector 200 can be suitably used as the phase detector 106 in an otherwise conventional delay lock loop circuit 100 shown in FIG. 1. According to an exemplary embodiment of a system, the phase detector 200 is combined with a nonlinear digital filter, in the filter/control circuit 108 to minimize nonlinear behavior of the phase detector 200. The nonlinearity of the filter/control circuit 108 is applied to cancel the nonlinearity of the bang bang phase detector 200, which results in low jitter when in a lock mode.

The phase detector 200 includes a data signal line 201 and a clock signal line 203. The clock signal line 203 is adapted to carry a clock signal. The data signal line 201 is adapted to carry a data signal, or even a clock feedback signal for comparison with a reference clock signal. The phase detector 200 also includes a delay cell 202 having an input coupled to the data signal line 201. The phase detector 200 further includes a first double flip-flop 204 having a data input coupled to the data signal line and a clock input coupled to the clock signal line, and a second double flip-flop 206 having a data input coupled to an output of the delay cell 202 and a clock input coupled to the clock signal line 203. A NOR circuit 208 is provided having a first input coupled to an output of the first double flip-flop 204 and a second input coupled to an output of the second double flip-flop 206. A lag output signal line is coupled to an output of the NOR circuit 208, and a lead output signal line coupled to the output of the second double flip-flop 206. The delay of the delay cell 202 is preferably larger than the metastability region of each double flip-flop 204 and 206.

According to the preferred embodiment, the first double flip-flop 204 includes a first flip-flop 210 having a data input coupled to the data signal line 201 and a clock input coupled to the clock signal line 203, and a second flip-flop 212 having a data input coupled to an output of the first flip-flop 210 and a clock input coupled to the clock signal line 203. The second double flip-flop 206 includes a third flip-flop 214 having a data input coupled to an output of the delay cell 202 and a clock input coupled to the clock signal line 203, and a fourth flip-flop 216 having a data input coupled to an output of the third flip-flop 214 and a clock input coupled to the clock signal line 203.

The phase detector 200 of FIG. 2 is included in a digital delay lock loop (DLL), such as shown in the global clock tree de-skew circuit 100 of FIG. 1, as follows. When the lag output signal is HIGH, the loop control circuit 108 in FIG. 1 will downcount. When the lead output signal and the lag output signal are respectively HIGH and LOW, the filter/control circuit 108 will stay the same, the nodes a and b in FIG. 2 will be a=1 and b=0, and the DLL is in the lock condition. In the lock condition, the phase detector output lead output signal and lag output signal will both the 0, and the filter/control will be unchanged, and oscillation is eliminated. The loop control circuit 108 continuously receives data lead and lag from the lead signal output line 211 and lag signal output line 209, respectively.

The global clock tree de-skew circuit 100 can be embodied in hardware as an integrated circuit, or packaged with other circuits. FIG. 3 is a simplified circuit diagram of a circuit 300 including a digital DLL circuit 302 used for global clock tree de-skew. The DLL circuit 302 includes a local reference clock input 301, an incoming clock input 303, and a clock output 305. The DLL circuit 300 generates an output clock signal for the clock output 305, where the output clock signal represents a phase lock between an incoming clock signal on the incoming clock input 303 and a local reference clock signal input on the local reference clock input 301.

The circuit 300 further includes a clock tree 310 having an input connected to the clock output 305 for receiving the output clock signal. The clock tree 310 outputs global clock signal on global clock signal output 312. The global clock signal output 312 forms a loop with a feedback line connected to the incoming clock input 303. In accordance with the invention, the circuit 300 aligns the incoming clock signal with the local reference clock signal, where the incoming clock signal is a skewed version of the local reference clock signal by way of the feedback line. Alternatively, the skew may be generated by clock tree 310 insertion delay or long wire routing through an circuit or group of circuits.

While various embodiments of the invention are described above, it should be understood that they are presented for example only, and not as limitations to the following claims. Accordingly, the scope and breadth of the present invention should only be defined in accordance with the following claims and their equivalents.

What is claimed is:

1. A circuit for de-skewing a global clock tree, comprising:

a digital delay lock loop having an incoming clock input, a local reference clock input, and a clock output providing an output clock signal representing a phase lock between an incoming clock signal on the incoming clock input and a local reference clock signal on the local reference clock input, and a clock tree for receiving the output clock signal and outputting a global clock signal;

wherein the incoming clock signal input is connected to an output of the clock tree; and wherein the digital delay lock loop comprises a clock variable delay unit (VDU) having a first input and a second input connected to the local reference clock input, a clock buffer having an input and a second input connected to the incoming clock input, a phase detector having a first input connected to an output of the clock buffer and a second input connected to the local reference clock input, a lock detector having an input connected to an output of the phase detector, and a loop control circuit having an input connected to the output of the phase detector and an output connected to the second input of the clock VDU.

2. The circuit of claim 1, wherein an output of the clock VDU is connected to an input of the clock tree.

3. A circuit for de-skewing a global clock tree, comprising:

digital delay lock loop, comprising a clock variable delay unit (VDU), a clock buffer, a phase detector having a first input connected to an output of the clock buffer, a lock detector having an input directly connected to an output of the phase detector, and a loop control having an input directly connected to the output of the phase detector and an output connected to a first input of the clock VDU, an incoming clock signal input connected to an input of the clock buffer; and a local reference clock signal input connected to a second input of the clock VDU and to a second input of the phase detector.

4. The circuit of claim 3, further comprising a clock tree connected to the output of the clock VDU.

5. The circuit of claim 3, wherein the clock tree is configured to receive an output clock signal representing a phase lock between an incoming clock signal on the incoming clock signal input and a local reference clock signal input on the local reference clock signal input, and for outputting a global clock signal.

6. The circuit of claim 3, wherein the clock VDU is configured to vary a delay of a local reference clock signal on the local reference clock signal input.

7. The circuit of claim 6, wherein the phase detector is configured to detect a phase difference between an incoming clock signal on the incoming clock signal input and the reference clock signal.

8. The circuit of claim 7, wherein the lock detector is configured to output a lock detection signal when the incoming clock signal and the reference clock signal are phase aligned.

9. The circuit of claim 8, further comprising a clock tree connected to the output of the clock VDU.

* * * * *